US009006088B2

(12) United States Patent
Zhao et al.

(10) Patent No.: US 9,006,088 B2
(45) Date of Patent: Apr. 14, 2015

(54) METHOD FOR FORMING SEMICONDUCTOR GATE STRUCTURE AND SEMICONDUCTOR GATE STRUCTURE

(71) Applicant: Tsinghua University, Beijing (CN)

(72) Inventors: Mei Zhao, Beijing (CN); Renrong Liang, Beijing (CN); Jing Wang, Beijing (CN); Jun Xu, Beijing (CN)

(73) Assignee: Tsinghua University, Beijing (CN)

( * ) Notice: Subject to any disclaimer, the term of this patent is extended or adjusted under 35 U.S.C. 154(b) by 87 days.

(21) Appl. No.: 13/980,803

(22) PCT Filed: Jun. 14, 2013

(86) PCT No.: PCT/CN2013/077256
§ 371 (c)(1),
(2) Date: Jul. 19, 2013

(87) PCT Pub. No.: WO2014/161231
PCT Pub. Date: Oct. 9, 2014

(65) Prior Publication Data
US 2014/0291727 A1 Oct. 2, 2014

(30) Foreign Application Priority Data

Apr. 1, 2013 (CN) .......................... 2013 1 0111607
Apr. 1, 2013 (CN) .......................... 2013 1 0111662

(51) Int. Cl.
H01L 29/78 (2006.01)
H01L 21/316 (2006.01)
(Continued)

(52) U.S. Cl.
CPC .... *H01L 21/31654* (2013.01); *H01L 21/28255* (2013.01); *H01L 29/408* (2013.01); *H01L 29/4232* (2013.01); *H01L 29/78* (2013.01)

(58) Field of Classification Search
USPC .......... 257/192; 438/585, 255, 460, 694, 758
See application file for complete search history.

(56) References Cited

U.S. PATENT DOCUMENTS 8,647,439 B2 * 2/2014 Sanchez et al. ................ 134/1.2
2005/0199879 A1 9/2005 Hoffman et al.
(Continued)

FOREIGN PATENT DOCUMENTS

CN 103151255 A 6/2013

OTHER PUBLICATIONS

"Formation of High-Quality Ge1-xSnx Layer on Ge(110) Substrate with Strain-Induced Confinement of Stacking Faults at Ge1-xSnx/Ge Interface", Asano, et. al. Applied Physics Express 7, 061301 (2014).*
(Continued)

*Primary Examiner* — Thao X Le
*Assistant Examiner* — Sheng Zhu
(74) *Attorney, Agent, or Firm* — David D. Brush; Westman, Champlin & Koehler, P.A.

(57) ABSTRACT

A method for forming a semiconductor gate structure and a semiconductor gate structure are provided. The method includes: providing a substrate with a Ge layer as a surface thereof; forming a Sn layer on the Ge layer, in which an interface between the Ge layer and the Sn layer is a GeSn layer; removing the Sn layer to expose the GeSn layer; forming a GeSnO$_x$ passivation layer by performing an oxidation treatment for the GeSn layer, or forming a GeSnN or GeSnON passivation layer by performing a passivation treatment for the GeSn layer; and forming a gate stack on the GeSnO$_x$, GeSnN or GeSnON passivation layer.

8 Claims, 8 Drawing Sheets (51) Int. Cl.
  *H01L 21/28* (2006.01)
  *H01L 29/40* (2006.01)
  *H01L 29/423* (2006.01)

(56) References Cited

U.S. PATENT DOCUMENTS

| | | | | |
|---|---|---|---|---|
| 2012/0318334 | A1* | 12/2012 | Bedell et al. | 136/255 |
| 2013/0288480 | A1* | 1/2013 | Sanchez et al. | 438/694 |
| 2013/0256838 | A1* | 10/2013 | Sanchez et al. | 257/616 |
| 2014/0027823 | A1* | 1/2014 | Lee et al. | 257/288 |

OTHER PUBLICATIONS

International Search Report and Written Opinion dated Dec. 12, 2013 for corresponding International Application No. PCT/CN2013/077256, filed Jun. 14, 2013.

Gupta, S. et al., Towards High Mobility DeSn Channel nMOSFETs: Improved Surface Passivation Using Novel Ozone Oxidation Method. IEDM 12-375. Dec. 31, 2012, pp. 16.2.1-16.2.2, figures 7-8, 10-13.

* cited by examiner

METHOD FOR FORMING SEMICONDUCTOR GATE STRUCTURE AND SEMICONDUCTOR GATE STRUCTURE

CROSS-REFERENCE TO RELATED APPLICATIONS

This Application is a Section 371 National Stage Application of International Application No. PCT/CN2013/077256, filed Jun. 14, 2013, which is incorporated by reference in its entirety and has not yet published, and which claims priority to and benefits of following patent applications.

(1) Chinese Patent Application Serial No. 201310111662.1, filed with the State Intellectual Property Office of P. R. China on Apr. 1, 2013; and (2) Chinese Patent Application Serial No. 201310111607.2, filed with the State Intellectual Property Office of P. R. China on Apr. 1, 2013.

The entire contents of above patent applications are incorporated herein by reference in their entireties.

FIELD

The present disclosure relates to a semiconductor device fabrication and design field, and more particularly to a method for forming a semiconductor gate structure and a semiconductor gate structure formed by the same.

BACKGROUND

Since Ge has a higher carrier mobility than Si and a poor stability of a Ge oxide may be overcome by using a high k dielectric, Ge which is used as an advanced material of a device substrate or a channel has attracted much attention. However, by directly depositing the high k dielectric on a Ge surface cleaned with a dilute HF solution, a device generally has disadvantages of high interface charge trap density and large leakage current. An interface problem between the high k dielectric and a Ge substrate is a critical issue because of a poor thermal stability, a water solubility and a poor electrical performance of the Ge oxide. In order to solve this problem, many solutions have been presented, for example, including adding a $GeO_2$ or $GeO_xN_y$ interface layer, performing a sulfidizing treatment for the Ge surface, and doping fluorine ions in the interface. However, the high interface charge trap density and large leakage current are not effectively improved by the above solutions.

SUMMARY

The present disclosure is aimed to solve at least one of the defects.

According to a first aspect of the present disclosure, a method for forming a semiconductor gate structure is provided. The method comprises steps of: providing a substrate with a Ge layer as a surface thereof; forming a Sn layer on the Ge layer, in which an interface between the Ge layer and the Sn layer is a GeSn layer; removing the Sn layer to expose the GeSn layer; forming a $GeSnO_x$ passivation layer by performing an oxidation treatment for the GeSn layer, or forming a GeSnN or GeSnON passivation layer by performing a passivation treatment for the GeSn layer; and forming a gate stack on the $GeSnO_x$, GeSnN or GeSnON passivation layer.

In one embodiment, before removing the Sn layer, the method further comprises: performing an annealing process to improve the GeSn layer.

In one embodiment, the Sn layer is removed by a solution with a high etching selection ratio between Sn and GeSn to expose the GeSn layer.

In one embodiment, a thickness of the GeSn layer remained ranges from 0.5 nm to 40 nm.

In one embodiment, the oxidation treatment comprises: performing an oxidation annealing in an atmosphere containing oxygen and/or oxygen plasma to change all or a part of the GeSn layer into the $GeSnO_x$ passivation layer; and the passivation treatment comprises: performing a passivation annealing in an atmosphere containing nitrogen and/or nitrogen plasma to change all or a part of the GeSn layer into the GeSnN or GeSnON passivation layer.

In one embodiment, a temperature of the oxidation annealing ranges from 100° C. to 500° C., and a temperature of the passivation annealing ranges from 100° C. to 600° C.

In one embodiment, the oxidation treatment comprises: performing a wet chemical oxidation in an oxidizing solution to change all or a part of the GeSn layer into the $GeSnO_x$ passivation layer.

In one embodiment, the substrate with the Ge layer as the surface thereof comprises a pure Ge substrate or a substrate with a Ge film as a surface layer thereof.

With the method for forming the semiconductor gate structure according to embodiments of the present disclosure, the $GeSnO_x$, GeSnN or GeSnON passivation layer is formed between the substrate with a Ge surface and the gate stack, an electrical performance of a gate stack on a Ge substrate is improved, that is, an interface charge trap density and a leakage current are both reduced. In addition, the method is easy to implement.

According to a second aspect of the present disclosure, a semiconductor gate structure is provided. The semiconductor gate structure comprises: a substrate with a Ge layer as a surface thereof; a GeSn layer formed on the Ge layer; a $GeSnO_x$, GeSnN or GeSnON passivation layer formed on the GeSn layer; and a gate stack formed on the $GeSnO_x$, GeSnN or GeSnON passivation layer.

In one embodiment, the GeSn layer is formed by initially forming a Sn layer on the Ge layer, and then forming the GeSn layer at an interface between the Ge layer and the Sn layer by a natural formation or an annealing.

In one embodiment, the $GeSnO_x$ passivation layer is formed from a surface portion of the GeSn layer by performing an oxidation annealing in an atmosphere containing oxygen and/or oxygen plasma; and the GeSnN or GeSnON passivation layer is formed from a surface portion of the GeSn layer by performing a passivation annealing in an atmosphere containing nitrogen and/or nitrogen plasma.

In one embodiment, a temperature of the oxidation annealing ranges from 100° C. to 500° C., and a temperature of the passivation annealing ranges from 100° C. to 600° C.

In one embodiment, the $GeSnO_x$ passivation layer is formed from a surface portion of the GeSn layer by performing a wet chemical oxidation in an oxidizing solution.

In one embodiment, the surface portion of the GeSn layer is exposed by removing the Sn layer on the GeSn layer by a solution with a high etching selection ratio between Sn and GeSn.

In one embodiment, a thickness of the GeSn layer remained ranges from 0.5 nm to 40 nm.

In one embodiment, the substrate with the Ge layer as the surface thereof comprises a pure Ge substrate or a substrate with a Ge film as a surface layer thereof.

The semiconductor gate structure according to embodiments of the present disclosure has the $GeSnO_x$, GeSnN or GeSnON passivation layer between the substrate with a Ge surface and the gate stack, as well as has the high quality GeSn layer between the Ge surface and the passivation layer. Moreover, a thickness of the GeSn layer and the passivation layer is controllable. Therefore, an electrical performance of a gate stack on a Ge substrate is improved, that is, an interface charge trap density and a leakage current are both reduced. In addition, the semiconductor gate structure has an advantage of low cost.

According to a third aspect of the present disclosure, a semiconductor gate structure is provided. The semiconductor gate structure comprises: a substrate with a Ge layer as a surface thereof; a $GeSnO_x$, GeSnN or GeSnON passivation layer formed on the Ge layer; and a gate stack formed on the $GeSnO_x$, GeSnN or GeSnON passivation layer.

In one embodiment, the $GeSnO_x$, GeSnN or GeSnON passivation layer is formed by steps of: forming a Sn layer on the Ge layer, and forming a GeSn layer at an interface between the Ge layer and the Sn layer by a natural formation or an annealing; removing the Sn layer on the GeSn layer by a solution with a high etching selection ratio between Sn and GeSn to expose the GeSn layer; and performing an oxidation annealing in an atmosphere containing oxygen and/or oxygen plasma to change all of the GeSn layer into the $GeSnO_x$ passivation layer, or performing an passivation annealing in an atmosphere containing nitrogen and/or nitrogen plasma to change all of the GeSn layer into the GeSnN or GeSnON passivation layer.

In one embodiment, a temperature of the oxidation annealing ranges from 100° C. to 500° C., and a temperature of the passivation annealing ranges from 100° C. to 600° C.

In one embodiment, the $GeSnO_x$ passivation layer is formed by steps of: forming a Sn layer on the Ge layer, and forming a GeSn layer at an interface between the Ge layer and the Sn layer by a natural formation or an annealing; removing the Sn layer on the GeSn layer by a solution with a high etching selection ratio between Sn and GeSn to expose the GeSn layer; and performing a wet chemical oxidation in an oxidizing solution to change all of the GeSn layer into the $GeSnO_x$ passivation layer.

In one embodiment, the substrate with the Ge layer as the surface thereof comprises a pure Ge substrate or a substrate with a Ge film as a surface layer thereof.

The semiconductor gate structure according to embodiments of the present disclosure has the $GeSnO_x$, GeSnN or GeSnON passivation layer between the substrate with a Ge surface and the gate stack. Therefore, an electrical performance of a gate stack on a Ge substrate is improved, that is, an interface charge trap density and a leakage current are both reduced. In addition, the semiconductor gate structure has an advantage of low cost.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

In addition, terms such as "first" and "second" are used herein for purposes of description and are not intended to indicate or imply relative importance or significance.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature, and may also include an embodiment in which an additional feature is formed between the first feature and the second feature so that the first feature does not directly contact the second feature.

Figure 1:
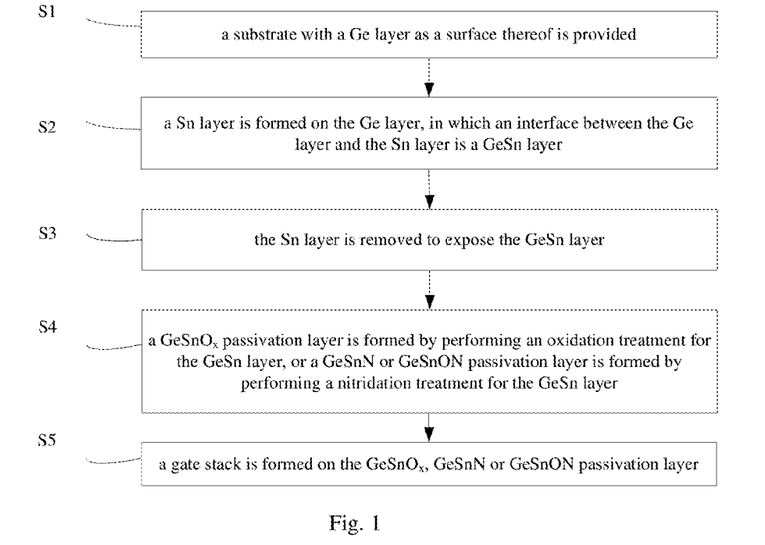
FIG. 1 a flow chart of a method for forming a semiconductor gate structure according to an embodiment of the present disclosure.

FIG. 1 is a flow chart of a method for forming a semiconductor gate structure according to an embodiment of the present disclosure. As shown in FIG. 1, the method comprises following steps.

In step S1, a substrate with a Ge layer as a surface thereof is provided. Specifically, the substrate with the Ge layer as the surface thereof may be a pure Ge substrate or a substrate with a Ge film as a surface layer thereof, such as a Si substrate with a Ge film as a surface layer thereof.

In step S2, a Sn layer is formed on the Ge layer, in which an interface between the Ge layer and the Sn layer is a GeSn layer. Specifically, the Sn layer may be formed on the Ge layer by magnetron sputtering or electron beam evaporation. During these processes, a temperature of the substrate may range from a room temperature to 200° C. Preferably, before removing the Sn layer, an annealing process may be performed to improve the GeSn layer, that is, to thicken the GeSn layer. The annealing temperature may range from 50° C. to 200° C. The higher the annealing temperature is and the longer the annealing time is, the thicker the GeSn layer is.

It should be noted that, here "GeSn" does not mean that a GeSn molecule with an atom ratio of Ge to Sn is 1:1, but refers to a GeSn solid solution in which a small portion of Ge atoms in Ge crystal structure are substituted by Sn atoms. The GeSn layer formed by diffusion during the annealing process is a solid solution, which has a similar crystal structure to Ge and has an excellent semiconductor property, for example, GeSn has a higher hole mobility than Ge. Therefore, the formation of GeSn layer on the Ge layer generally does not deteriorate a performance of a Ge device.

In step S3, the Sn layer is removed to expose the GeSn layer. Specifically, the Sn layer is removed by a solution with a high etching selection ratio between Sn and GeSn. A usual solution for cleaning comprises: diluted HCl, diluted $H_2SO_4$ and diluted HF solution. A thickness of the GeSn layer remained after cleaning ranges from 0.5 nm to 40 nm, and the thickness of the GeSn layer ranging from 0.5 nm to 10 nm is preferred.

In step S4, a $GeSnO_x$ passivation layer is formed by performing an oxidation treatment for the GeSn layer, or a GeSnN or GeSnON passivation layer is formed by performing a passivation treatment for the GeSn layer.

Specifically, the oxidation treatment may comprise: performing an oxidation annealing in an atmosphere containing oxygen and/or oxygen plasma to change all or a part of the GeSn layer into the $GeSnO_x$ passivation layer; and the passivation treatment may comprise: performing a passivation annealing in an atmosphere containing nitrogen and/or nitrogen plasma to change all or a part of the GeSn layer into the GeSnN or GeSnON passivation layer. Since the GeSn layer has an excellent semiconductor property, even if there is an unoxidized GeSn layer between the Ge layer and the passivation layer, the performance of the Ge device may not be deteriorated, but may be improved.

Specifically, the atmosphere of the oxidation annealing may contain oxygen, ozone, oxygen plasma, a vapor containing oxygen, etc. A temperature of the oxidation annealing ranges from 100° C. to 500° C., and the temperature of the oxidation annealing ranging from 200° C. to 400° C. is preferred.

Specifically, the atmosphere of the passivation annealing may contain nitrogen, ammonia, nitric oxide, nitrogen dioxide, nitrogen plasma, etc. A temperature of the passivation annealing ranges from 100° C. to 600° C., and the temperature of the passivation annealing ranging from 200° C. to 400° C. is preferred.

It should be noted that, in principle, the passivation annealing in the atmosphere containing nitrogen and/or nitrogen plasma forms a nitride passivation layer (i.e. the GeSnN layer). However, in practice, an oxynitride passivation layer (i.e. the GeSnON layer) may be formed, because there may be trace oxygen in the atmosphere, and the GeSn layer may be exposed in an air containing oxygen, while a binding ability of oxygen and the GeSn layer is higher than that of nitrogen and the GeSn layer. It should also be noted that, here "GeSnN" or "GeSnON" does not mean that an atom ratio of N or ON to GeSn or an atom ratio of 0 to N is 1:1. Instead, "GeSnN" or "GeSnON" refers to a GeSn nitride or a GeSn oxynitride. A specific nitride or oxynitride content relates to an actual passivation process.

Alternatively, the oxidation treatment may comprise: performing a wet chemical oxidation in an oxidizing solution to change all or a part of the GeSn layer into the $GeSnO_x$ passivation layer. Specifically, the oxidizing solution may be an aqueous hydrogen peroxide solution with a concentration of 0.1-20 wt. % or an aqueous ozone solution with a concentration of 1-30 ppm, and an reaction temperature ranges from 20° C. to 80° C.

In step S5, a gate stack is formed on the $GeSnO_x$, GeSnN or GeSnON passivation layer. Specifically, a gate dielectric layer is formed on the passivation layer and then a gate electrode is formed on the gate dielectric layer. In one embodiment, a material of the gate dielectric layer comprises a high k dielectric material such as $HfO_2$, $Al_2O_3$ or $ZrO_2$, and a material of the gate electrode may be TiN or TaN. It should be noted that the materials recited herein are merely used for convenience of illustration, and the material selection of the gate dielectric layer and the gate electrode may be determined according to practice.

With the method for forming the semiconductor gate structure according to embodiments of the present disclosure, the $GeSnO_x$, GeSnN or GeSnON passivation layer is formed between the substrate with a Ge surface and the gate stack, an electrical performance of a gate stack on a Ge substrate is improved, that is, an interface charge trap density and a leakage current are both reduced. In addition, the method is easy to implement.

Figure 2:
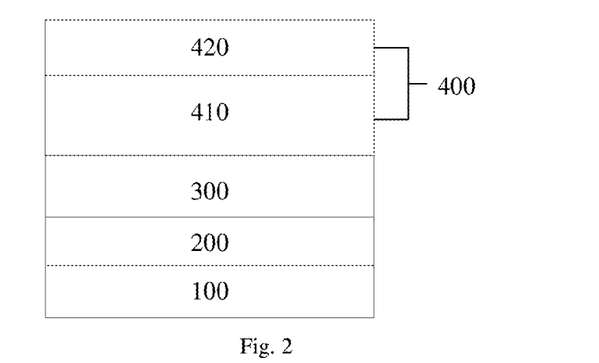
FIG. 2 is a schematic cross-sectional view of a semiconductor gate structure according to a first embodiment of the present disclosure.

FIG. 2 is a schematic cross-sectional view of a semiconductor gate structure according to a first embodiment of the present disclosure. As shown in FIG. 2, the semiconductor gate structure comprises: a substrate with a Ge layer 100 as a surface thereof; a GeSn layer 200 formed on the Ge layer 100; a GeSnO$_x$, GeSnN or GeSnON passivation layer 300 formed on the GeSn layer 200; and a gate stack 400 formed on the passivation layer 300.

Specifically, the substrate with the Ge layer as the surface thereof may be a pure Ge substrate or a substrate with a Ge film as a surface layer thereof, such as a Si substrate with a Ge film as a surface layer thereof.

Specifically, the GeSn layer 200 is formed by initially forming a Sn layer (not shown in FIG. 2) on the Ge layer 100, and then forming the GeSn layer 200 at an interface between the Ge layer 100 and the Sn layer by a natural formation or an annealing process. Here, the GeSn layer 200 is thickened by the annealing process. A temperature of the annealing process may range from 50° C. to 200° C. The higher the annealing temperature is and the longer an annealing time is, the thicker the GeSn layer is. The GeSn layer formed by diffusion during the annealing is a solid solution, which has a similar crystal structure to Ge and has an excellent semiconductor property, for example, GeSn has a higher hole mobility than Ge. Therefore, the formation of GeSn layer on the Ge layer generally does not deteriorate a performance of a Ge device, but may improve the performance of the Ge device.

Specifically, the GeSnO$_x$ passivation layer 300 is formed from a surface portion of the GeSn layer 200 by oxidation treatment, for example, by performing an oxidation annealing in an atmosphere containing oxygen and/or oxygen plasma. In one embodiment, the atmosphere of the oxidation annealing may contain oxygen, ozone, oxygen plasma, a vapor containing oxygen, etc. A temperature of the oxidation annealing ranges from 100° C. to 500° C., and the temperature of the oxidation annealing ranging from 200° C. to 400° C. is preferred. Alternatively, the GeSnO$_x$ passivation layer 300 is formed from a surface portion of the GeSn layer 200 by performing a wet chemical oxidation in an oxidizing solution. In one embodiment, the oxidizing solution may be an aqueous hydrogen peroxide solution with a concentration of 0.1-20 wt. % or an aqueous ozone solution with a concentration of 1-30 ppm, and an reaction temperature ranges from 20° C. to 80° C.

Specifically, the GeSnN or GeSnON passivation layer 300 is formed from a surface portion of the GeSn layer 200 by passivation treatment, for example, by performing a passivation annealing in an atmosphere containing nitrogen and/or nitrogen plasma. In one embodiment, the atmosphere of the passivation annealing may contain nitrogen, ammonia, nitric oxide, nitrogen dioxide, nitrogen plasma, etc. A temperature of the passivation annealing ranges from 100° C. to 600° C., and the temperature of the passivation annealing ranging from 200° C. to 400° C. is preferred.

It should be noted that, the surface portion of the GeSn layer 200 is exposed by removing the Sn layer on the GeSn layer 200 by a solution (such as diluted HCl, diluted H$_2$SO$_4$ or diluted HF solution) with a high etching selection ratio between Sn and GeSn. A thickness of the GeSn layer remained after cleaning ranges from 0.5 nm to 40 nm, and the thickness of the GeSn layer ranging from 0.5 nm to 10 nm is preferred.

Specifically, the gate stack 400 comprises a gate dielectric layer 410 and a gate electrode 420. In one embodiment, a material of the gate dielectric layer comprises a high k dielectric material such as HfO$_2$, Al$_2$O$_3$ or ZrO$_2$, and a material of the gate electrode may be TiN or TaN. It should be noted that the materials recited herein are merely used for convenience of illustration, and the material selection of the gate dielectric layer and the gate electrode may be determined according to practice.

Figure 3:
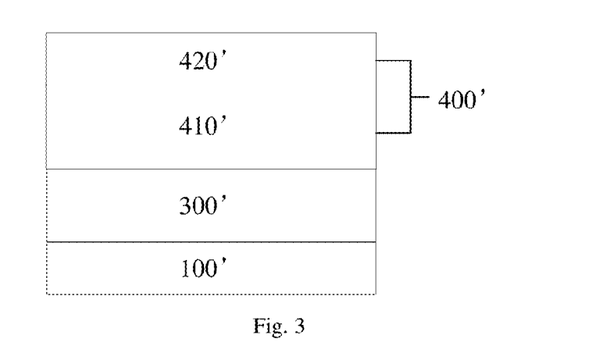
FIG. 3 is a schematic cross-sectional view of a semiconductor gate structure according to a second embodiment of the present disclosure.

FIG. 3 is a schematic cross-sectional view of a semiconductor gate structure according to a second embodiment of the present disclosure. As shown in FIG. 3, the semiconductor gate structure comprises: a substrate with a Ge layer 100' as a surface thereof; a GeSnO$_x$, GeSnN or GeSnON passivation layer 300' formed on the Ge layer 100'; and a gate stack 400' (comprising a gate dielectric layer 410' and a gate electrode 420') formed on the passivation layer 300'.

Compared with the first embodiment, the semiconductor gate structure according to the second embodiment lacks the GeSn layer which is totally changed into the passivation layer during the formation process. The semiconductor gate structures according to both embodiments are substantially identical except the point mentioned above. Therefore, for sake of concision, the semiconductor gate structure according to the second embodiment will not be described in details again.

The semiconductor gate structure according to embodiments of the present disclosure has the GeSnO$_x$, GeSnN or GeSnON passivation layer between the substrate with a Ge surface and the gate stack. Moreover, a thickness of the GeSn layer and the passivation layer is controllable. Therefore, an electrical performance of a gate stack on a Ge substrate is improved, that is, an interface charge trap density and a leakage current are both reduced. In addition, the semiconductor gate structure has an advantage of low cost.

In order to better understand the present disclosure, an explanatory embodiment will be described below in details with reference to FIGS. 4-11. In this embodiment, an ultrathin GeSnO$_x$, GeSnN or GeSnON passivation layer is introduced to passivate an interface between a high k dielectric layer and a Ge substrate. The ultrathin passivation layer with a thickness of 1 nm is formed by first sputtering a Sn layer on the Ge substrate, then removing a surface portion of the Sn layer by a diluted HCl, and then performing a thermal oxidation for the GeSn layer. It is found that compared with a Ge/HfO$_2$ MOS capacitor device without a passivation layer, a Ge/HfO$_2$ MOS capacitor device with a passivation layer has better electrical performance.

Specifically, firstly, a p-type Ge substrate (such as a Ge wafer) with a (100) surface and a resistivity of 0.09 Ω·cm is provided. Secondly, the Ge wafer is circularly rinsed by the diluted HF solution (1:50) and DI water, and a Sn layer is formed on the Ge wafer by magnetron sputtering. The substrate temperature is maintained at the room temperature during the magnetron sputtering. Thirdly, the wafer is immersed into the diluted HCl solution (10%) for 3 minutes to remove the surface portion of the Sn layer with the ultrathin GeSn layer remained on the Ge wafer. Fourthly, in an ALD (atom layer deposition) reacting chamber, if the thermal oxidation is performed in an atmosphere of N$_2$/O$_2$ at 400° C. for 30 minutes, the ultrathin GeSn layer is changed into a GeSnO$_x$ layer, and if a nitridation is performed in an atmosphere of NH$_3$ at 400° C. for 30 minutes, the ultrathin GeSn layer is changed into a GeSnON layer. Fifthly, using TEMAH (hafnium tetra(ethylmethylamide)) and water as a precursor, a HfO$_2$ layer with a thickness of 5.5 nm is deposited on the GeSnO$_x$ or GeSnON layer by ALD. Finally, an Al layer is formed on the HfO₂ layer by evaporation, and the HfO₂ layer and the Al layer are patterned to form a MOS capacitor.

Meanwhile, a control sample 1 is provided by providing another same Ge wafer, and after a pre-cleaning, performing the thermal oxidation in the atmosphere of $N_2/O_2$ for 30 minutes at 400° C. in the ALD reacting chamber followed by subsequent processes; and a control sample 2 is provided by providing another same Ge wafer, and after a pre-cleaning, performing the nitridation in the atmosphere of $NH_3$ for 30 minutes at 400° C. in the ALD reacting chamber followed by subsequent processes. For sake of convenience, a testing sample with the $GeSnO_x$ passivation layer is marked as a testing sample 1, and a testing sample with the GeSnON passivation layer is marked as a testing sample 2.

All samples are characterized by following means. (1) A composition and chemical state of each multilayer structure are analyzed by high resolution in-site XPS, and the XPS measurement is carried out while the sample surfaces are alternatively sputtered by $Ar^+$ ions so as to obtain a depth profile of each composition. (2) A cross-sectional microstructure and a thickness of an interface layer of each MOS capacitor are obtained by HRTEM. (3) A $C_g$-$V_g$ characteristic curve and a $J_g$-$V_g$ characteristic curve are obtained by Agilent B1500A semiconductor analyzer.

Figure 4A:
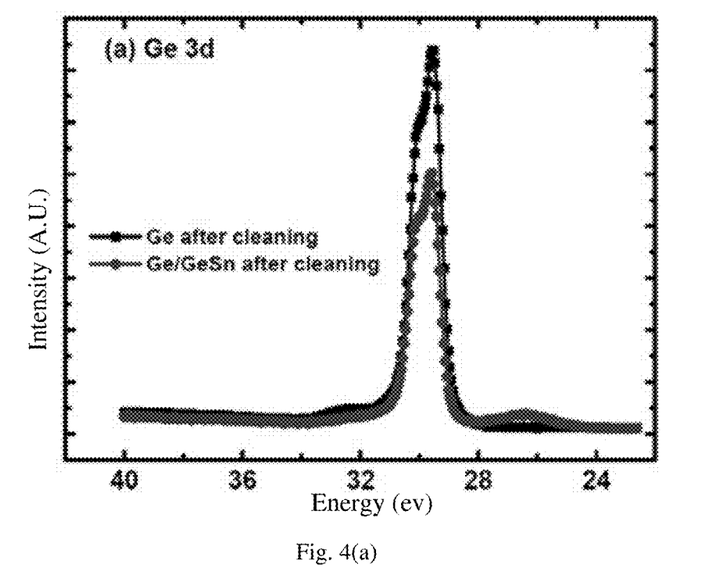
FIG. 4(a) shows XPS (x-ray photoelectron spectroscopy) Ge 3d energy spectra of a control sample 1 and a testing sample 1 after being cleaned by a diluted HCl solution.

FIG. 4(a) shows XPS (x-ray photoelectron spectroscopy) Ge 3d energy spectra of the control sample 1 and the testing sample 1 after being cleaned by the diluted HCl solution but not followed by subsequent processes. It can be seen that neither samples have a peek at 33.2 eV, which indicates that there is almost no any $GeO_x$ remained after cleaning.

Figure 4B:
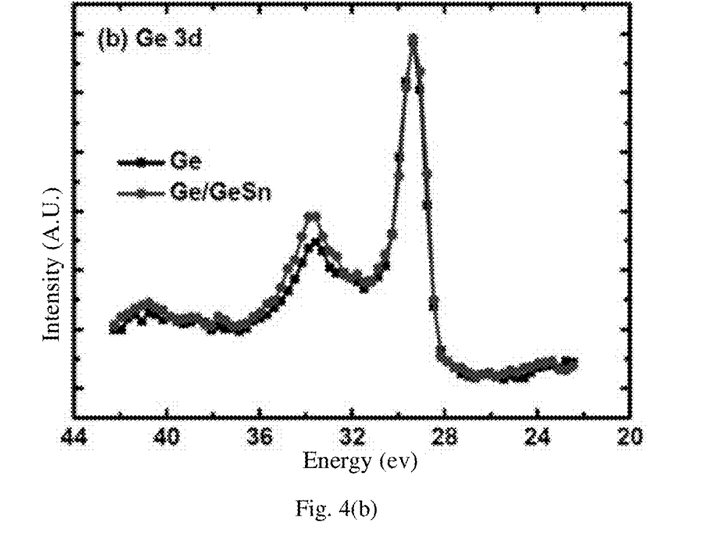
FIG. 4(b) shows XPS Ge 3d energy spectra of the control sample 1 and the testing sample 1 after being treated by a thermal oxidation in an atmosphere of $N_2/O_2$ at 400° C.

FIG. 4(b) shows XPS Ge 3d energy spectra of the control sample 1 and the testing sample 1 after being treated by the thermal oxidation in an atmosphere of $N_2/O_2$ at 400° C. It can be seen that a difference of peak binding energy between an oxide product and the Ge substrate is about 3.3 eV, that is, both samples have an obvious peak at 33.2 eV, which indicates that Ge—O bonds are formed in both the Ge layer and the GeSn layer during the thermal oxidation.

Figure 4C:
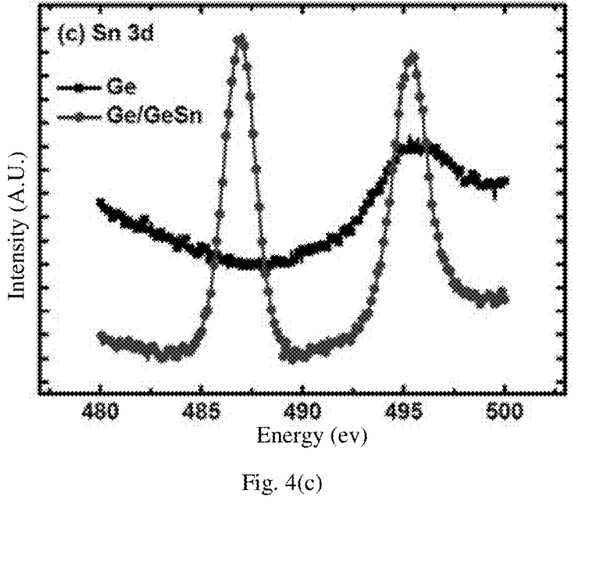
FIG. 4(c) shows XPS Sn 3d energy spectra of the control sample 1 and the testing sample 1 after being treated by the thermal oxidation in the atmosphere of $N_2/O_2$ at 400° C.

FIG. 4(c) shows XPS Sn 3d energy spectra of the control sample 1 and the testing sample 1 after being treated by the thermal oxidation in the atmosphere of $N_2/O_2$ at 400° C. The samples used here are identical with the samples of FIG. 4(b). For the testing sample 1, a peak at 487.2 eV indicates that a part of Sn atoms in Sn—O—Sn bonds of SnO are substituted by Ge atoms nearby with higher electronegativity so as to form Sn—O—Ge bonds, and thus it can be deduced that the $GeSnO_x$ layer is formed. Based on the XPS analysis, concentrations of Sn atoms and Ge atoms in the $GeSnO_x$ layer are 5.7% and 40.1% respectively. In addition, it can be known according to a deep analysis via an angle-resolved XPS that, the HfO₂ layer and the $GeO_x$ layer of the control sample 1 are partially mixed, while the HfO₂ layer and the $GeO_x$ layer of the testing sample 1 have a clear boundary.

Figure 5A:
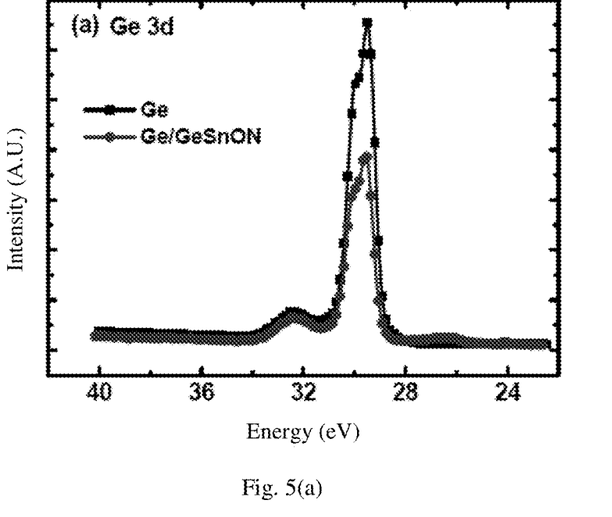
FIG. 5(a) shows XPS Ge 3d energy spectra of a control sample 2 and a testing sample 2 after being cleaned by the diluted HCl solution and annealed in an atmosphere of $NH_3$.

FIG. 5(a) shows XPS Ge 3d energy spectra of the control sample 2 and the testing sample 2 after being cleaned by the diluted HCl solution and annealed in an atmosphere of $NH_3$ but not followed by subsequent processes. Both samples have an obvious peak at 32.3 eV, which indicates that the Ge layer is partially oxidized to generate the $GeO_x$ layer during the annealing treatment. Moreover, the testing sample 2 after passivation has a small peak (i.e. Sn 4d peak) at around 26.5 eV.

Figure 5B:
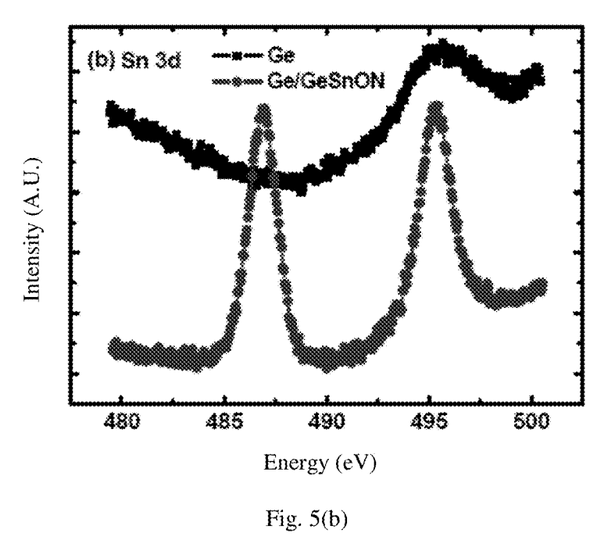
FIG. 5(b) shows XPS Sn 3d energy spectra of the control sample 2 and the testing sample 2 after being cleaned by the diluted HCl solution and annealed in the atmosphere of $NH_3$.

FIG. 5(b) shows XPS Sn 3d energy spectra of the control sample 2 and the testing sample 2 after being cleaned by the diluted HCl solution and annealed in the atmosphere of $NH_3$. The samples used here are identical with the samples of FIG. 5(a). For the testing sample 2, a peak around 487.2 eV is contributed to Ge—O—Sn bonds.

Figure 5C:
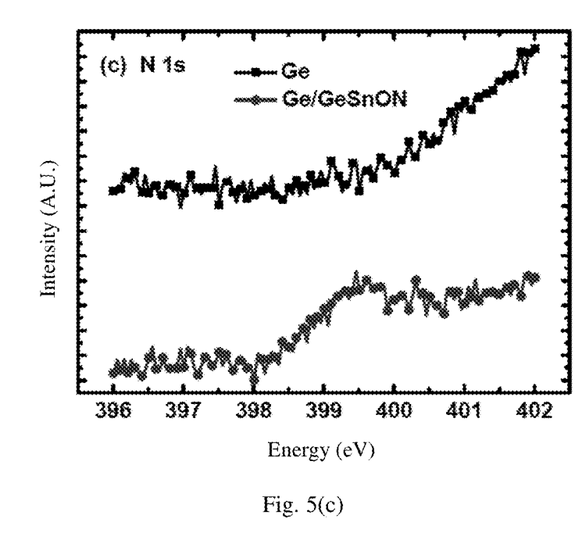
FIG. 5(c) shows XPS N 1s energy spectra of the control sample 2 and the testing sample 2 after being cleaned by the diluted HCl solution and annealed in the atmosphere of $NH_3$.
Figure 6:
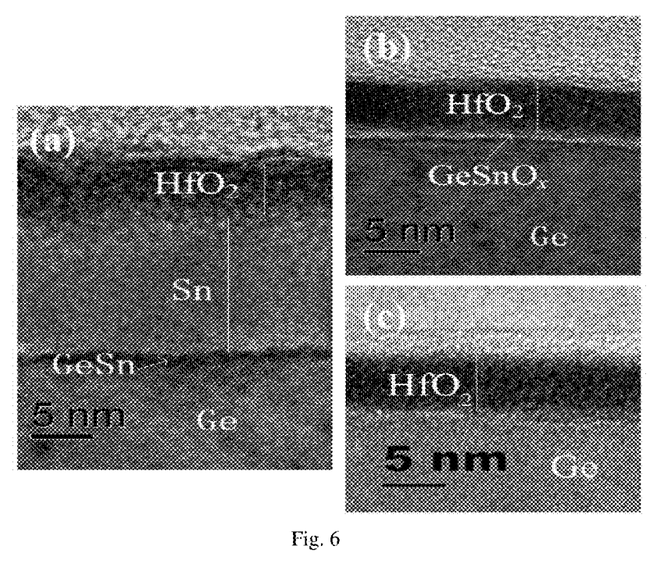
FIG. 6(a) is an HRTEM (high-resolution transmission electron microscopy) image showing a cross-sectional microstructure of a multilayer structure $Ge/Sn/HfO_2$ of the testing sample 1.
FIG. 6(b) is an HRTEM image showing a cross-sectional microstructure of a multilayer structure $Ge/GeSnO_x/HfO_2$ of the testing sample 1.
FIG. 6(c) is an HRTEM image showing a cross-sectional microstructure of a multilayer structure $Ge/HfO_2$ of the control sample 1.
Figure 7:
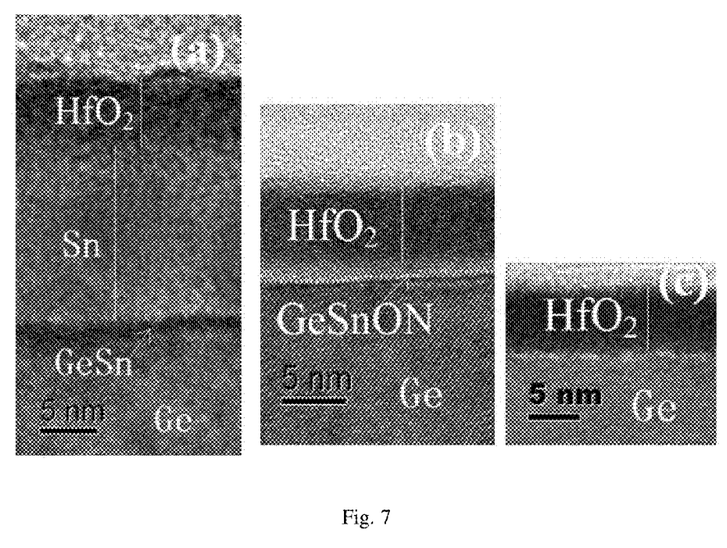
FIG. 7(a) is an HRTEM image showing a cross-sectional microstructure of a multilayer structure $Ge/Sn/HfO_2$ of the testing sample 2.
FIG. 7(b) is an HRTEM image showing a cross-sectional microstructure of a multilayer structure $Ge/GeSnON/HfO_2$ of the testing sample 2.
FIG. 7(c) is an HRTEM image showing a cross-sectional microstructure of a multilayer structure $Ge/HfO_2$ of the control sample 2.

FIG. 5(c) shows XPS N 1s energy spectra of the control sample 2 and the testing sample 2 after being cleaned by the diluted HCl solution and annealed in the atmosphere of $NH_3$. The samples used here are identical with the samples of FIG. 5(a) and FIG. 5(b). For the testing sample 2, there is a peak at 399.5 eV, while there is no corresponding peak for the control sample 2. The N is peak at 399.5 eV indicates that N element has appeared in the passivation layer after the annealing treatment. In connection with aforesaid analysis, it can be known that all or a part of the GeSn layer has been changed into the GeSnON layer. The N element can appear in the passivation layer after the annealing treatment in the atmosphere of $NH_3$ at 400° C., while no N atom appear in the Ge layer of the control sample 2, primarily because a chemical activity of Sn is higher than that of Ge.

FIGS. 6(a)-(c) show HRTEM images of the control sample 1 and the testing sample 1. FIG. 6(a) is an HRTEM image showing a cross-sectional microstructure of a multilayer structure Ge/Sn/HfO₂ of the testing sample 1. It can be seen that the Sn layer formed by sputtering is about 16 nm in thickness, and a GeSn layer with a thickness of about 1 nm is formed between the Sn layer and the Ge substrate. As shown in FIG. 6(b), an ultrathin $GeSnO_x$ layer with a thickness of about 1 nm is formed after cleaning by the diluted HCl solution and the thermal oxidation. The result indicates that the GeSn layer with a thickness of about 1 nm is changed into the $GeSnO_x$ layer during the thermal oxidation, which is consistent with the measurement result of XPS. In addition, it can be seen obviously from FIG. 6(b) that there is a clear boundary between a multilayer structure $GeSnO_x$/HfO₂ and the Ge substrate, while as shown in FIG. 6(c), there is no such boundary between the HfO₂ layer and the Ge substrate in the multilayer structure Ge/HfO₂.

FIGS. 7(a)-(c) show HRTEM images of the control sample 2 and the testing sample 2. FIG. 7(a) is an HRTEM image showing a cross-sectional microstructure of a multilayer structure Ge/Sn/HfO₂ of the testing sample 2. It can be seen that the Sn layer formed by sputtering is about 16 nm in thickness, and a GeSn layer with a thickness of about 1 nm is formed between the Sn layer and the Ge substrate. As shown in FIG. 7(b), an ultrathin GeSnON layer with a thickness of about 1 nm is formed after cleaning by the diluted HCl solution and the nitridation. The result indicates that the GeSn layer with a thickness of about 1 nm is changed into the GeSnON layer during the nitridation, which is consistent with the measurement result of XPS. In addition, it can be seen obviously from FIG. 7(b) that there is a clear boundary between a multilayer structure GeSnON/HfO₂ and the Ge substrate, while as shown in FIG. 7(c), there is no such boundary between the HfO₂ layer and the Ge substrate in the multilayer structure Ge/HfO₂.

Figure 8A:
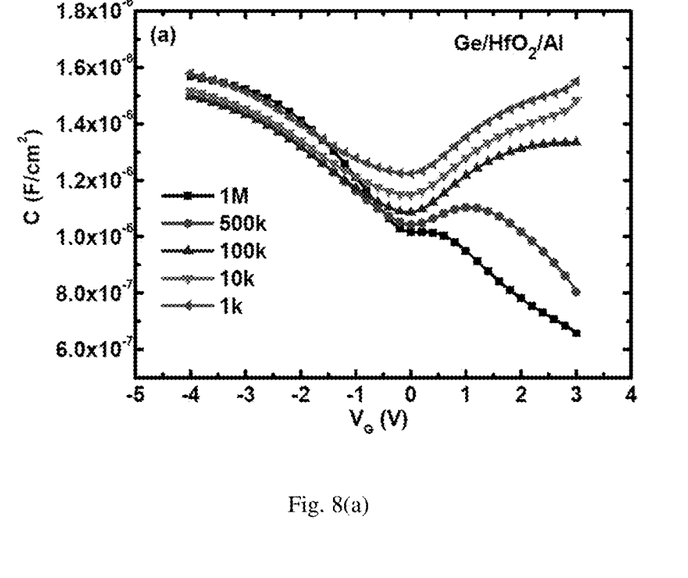
FIG. 8(a) shows $C_g$-$V_g$ (capacitance-voltage) characteristic curves of a MOS capacitor of a $Ge/HfO_2/Al$ structure of the control sample 1.
Figure 8B:
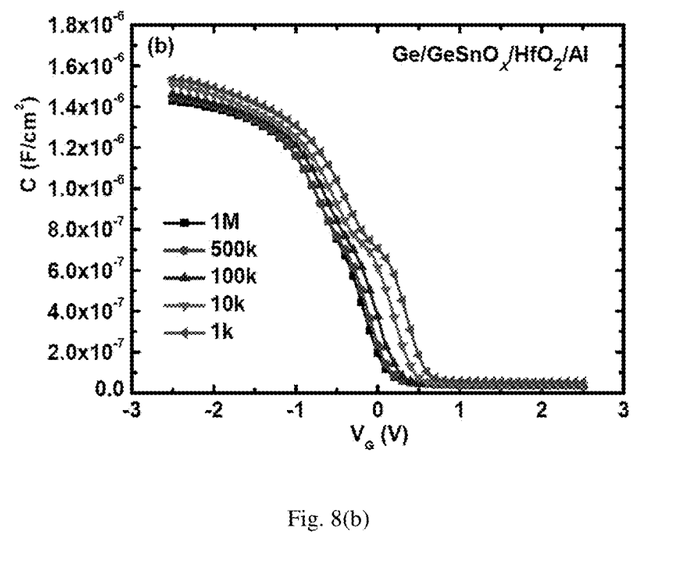
FIG. 8(b) shows $C_g$-$V_g$ characteristic curves of a MOS capacitor of a $Ge/GeSnO_x/HfO_2/Al$ structure of the testing sample 1.

FIG. 8(a) shows $C_g$-$V_g$ characteristic curves of a MOS capacitor of a Ge/HfO₂/Al structure of the control sample 1, and FIG. 8(b) shows $C_g$-$V_g$ characteristic curves of a MOS capacitor of a Ge/$GeSnO_x$/HfO₂/Al structure of the testing sample 1. For the MOS capacitor of the Ge/HfO₂/Al structure, the $C_g$-$V_g$ characteristic curve is distorted significantly in a reversal region because an excess $GeO_2$ exists at an interface between the Ge substrate and the gate dielectric HfO₂. For the MOS capacitor of the Ge/$GeSnO_x$/HfO₂/Al structure, the $C_g$-$V_g$ characteristic curve has a sharp abrupt slope with a slight warpage in the reversal region, which indicates a low interface state density. It can be known that by introducing the $GeSnO_x$ layer between the Ge substrate and the high k gate dielectric, an improved passivation effect may be realized. According to a conductance measurement, the interface state density of the MOS capacitor of the Ge/GeSnO$_x$/HfO$_2$/Al is about $5.3\times10^{11}$ cm$^{-2}\cdot$eV$^{-1}$. By using a Ge substrate simulator in connection with the C$_g$-V$_g$ characteristic, EOTs (equivalent oxide thickness) of the MOS capacitor of the Ge/HfO$_2$/Al structure and the MOS capacitor of the Ge/GeSnO$_x$/HfO$_2$/Al structure may be extracted, which are 2.2 nm and 2.31 nm respectively. Compared with the MOS capacitor of the Ge/HfO$_2$/Al structure, the EOT of the MOS capacitor of the Ge/GeSnO$_x$/HfO$_2$/Al structure is only increased by 0.11 nm, while a physical thickness is increased by about 1 nm. Therefore, it is advantageous to reduce the leakage current density of the gate stack while retaining a similar capacitance.

Figure 9:
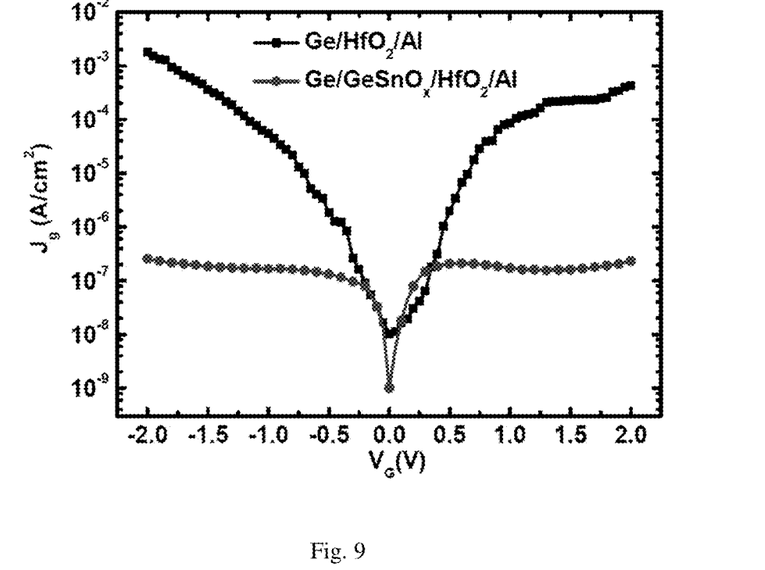
FIG. 9 shows $J_g$-$V_g$ (leakage current density-voltage) characteristic curves of the MOS capacitor of the $Ge/HfO_2/Al$ structure of the control sample 1 and the MOS capacitor of the $Ge/GeSnO_x/HfO_2/Al$ structure of the testing sample 1.

FIG. 9 shows J$_g$-V$_g$ characteristic curves of the MOS capacitor of the Ge/HfO$_2$/Al structure of the control sample 1 and the MOS capacitor of the Ge/GeSnO$_x$/HfO$_2$/Al structure of the testing sample 1. The leakage current density of the MOS capacitor of the Ge/GeSnO$_x$/HfO$_2$/Al structure is lower than $3\times10^{-7}$ A/cm$^2$ when a gate voltage ranges from −2V to 2V. When the gate voltage is 2V, the leakage current density of the MOS capacitor of the Ge/HfO$_2$/Al structure is about $1\times10^{-3}$ A/cm$^2$. Therefore, the leakage current density of the gate stack is reduced by about three orders of magnitude by introducing the GeSnO$_x$ layer.

Figure 10A:
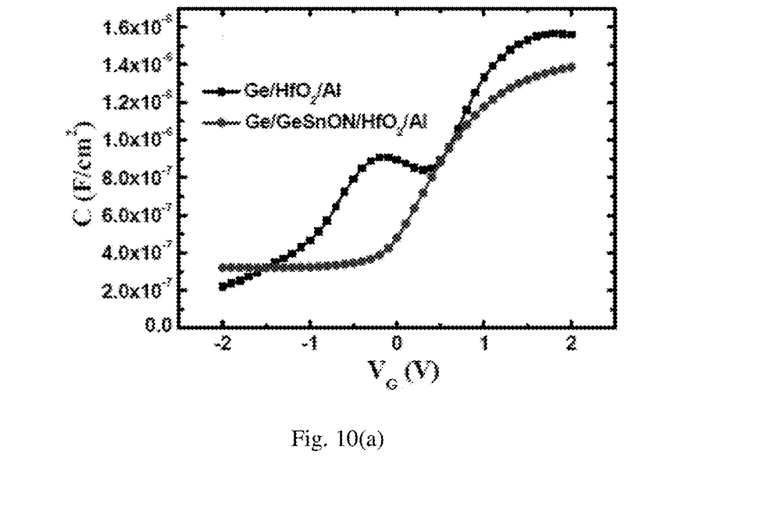
FIG. 10(a) shows $C_g$-$V_g$ characteristic curves of a MOS capacitor of a $Ge/HfO_2/Al$ structure of the control sample 2.
Figure 10B:
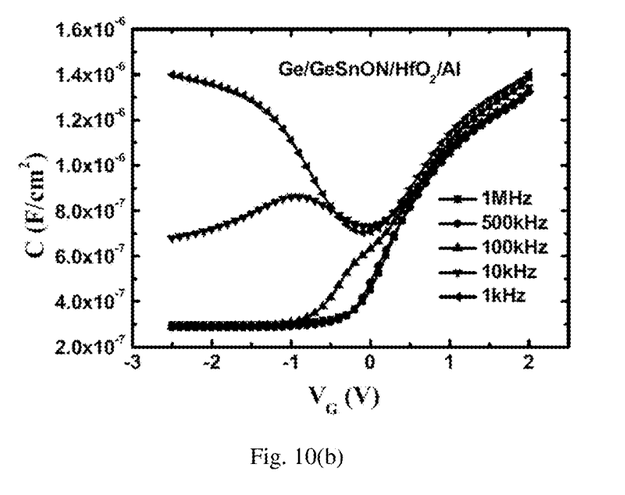
FIG. 10(b) shows $C_g$-$V_g$ characteristic curves of a MOS capacitor of a $Ge/GeSnON/HfO_2/Al$ structure of the testing sample 2.

FIG. 10(a) shows C$_g$-V$_g$ characteristic curves of a MOS capacitor of a Ge/HfO$_2$/Al structure of the control sample 2, and FIG. 10(b) shows C$_g$-V$_g$ characteristic curves of a MOS capacitor of a Ge/GeSnON/HfO$_2$/Al structure of the testing sample 2. A testing frequency is 1 MHz. The EOT of the MOS capacitor of the Ge/HfO$_2$/Al structure is 2.2 nm, and the EOT of the MOS capacitor of the Ge/GeSnON/HfO$_2$/Al structure is 2.43 nm, that is, the EOT of the MOS capacitor of the Ge/GeSnON/HfO$_2$/Al structure is only increased by 0.23 nm by introducing the GeSnON layer. For the MOS capacitor of the Ge/HfO$_2$/Al structure, the C$_g$-V$_g$ characteristic curve is distorted significantly in a reversal region because an excess GeO$_2$ exists at an interface between the Ge substrate and the gate dielectric HfO$_2$. However, For the MOS capacitor of the Ge/GeSnON/HfO$_2$/Al structure, the C$_g$-V$_g$ characteristic curve is good without frequency dispersion, warpage or fluctuation around a flat-band voltage, and merely has a slight frequency dispersion between 1 kHz and 1 MHz, which indicates an excellent property of the interface of Ge/GeSnON. According to the conductance measurement, the interface state density of the MOS capacitor of the Ge/HfO$_2$/Al structure of the control sample 2 and the MOS capacitor of the Ge/GeSnON/HfO$_2$/Al structure of the testing sample 2 are $1.2\times10^{13}$ cm$^{-2}$ eV$^{-1}$ and $4.6\times10^{11}$ cm$^{-2}$ eV$^{-1}$ respectively. Moreover, an interface state performance of the MOS capacitor of the Ge/GeSnON/HfO$_2$/Al structure of the testing sample 2 is equivalent to that of a MOS capacitor of a Ge/GeSnON/HfO$_2$/Al structure of a sample treated in the atmosphere of NH$_3$ at a higher temperature (such as ≥550° C.), which indicates that the GeSnON intermediate layer takes an effective interface passivation effect between the Ge channel and the high k dielectric.

Figure 11:
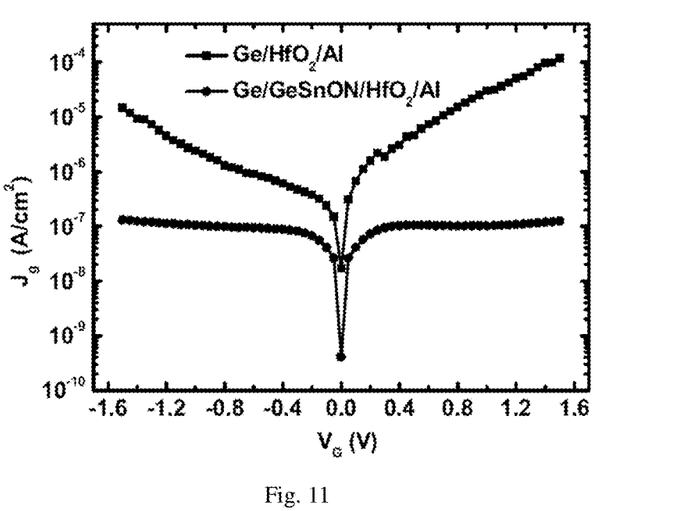
FIG. 11 shows $J_g$-$V_g$ characteristic curves of the MOS capacitor of the $Ge/HfO_2/Al$ structure of the control sample 2 and the MOS capacitor of the $Ge/GeSnON/HfO_2/Al$ structure of the testing sample 2.

FIG. 11 shows J$_g$-V$_g$ characteristic curves of the MOS capacitor of the Ge/HfO$_2$/Al structure of the control sample 2 and the MOS capacitor of the Ge/GeSnON/HfO$_2$/Al structure of the testing sample 2. The leakage current density of the MOS capacitor of the Ge/GeSnON/HfO$_2$/Al structure of the testing sample 2 is lower than that of the MOS capacitor of the Ge/HfO$_2$/Al structure of the control sample 2 by at least two orders of magnitude, particularly when the gate voltage ranges from −1.5V to 1.5V. The leakage current density of the MOS capacitor of the Ge/HfO$_2$/Al structure of the control sample 2 is lower than $2\times10^{-7}$ A/cm$^2$, which fulfills a requirement of a gate leakage current density in practical applications.

In summary, in this explanatory embodiment, by introducing the ultrathin GeSnO$_x$ or GeSnON layer to electrically passivate the interface between the Ge substrate and the high k dielectric, compared with a conventional method of directly depositing the high k dielectric on the Ge substrate, the interface state density and the leakage current density of both the MOS capacitor of the Ge/GeSnO$_x$/HfO$_2$/Al structure and the MOS capacitor of the Ge/GeSnON/HfO$_2$/Al structure are significantly reduced, while the respective EOT is only slightly increased. The electrical performance measurement results indicate that the electrical performance of the semiconductor gate structure formed by using this method is remarkably improved.

Reference throughout this specification to "an embodiment", "some embodiments", "one embodiment", "an example", "a specific examples", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "an example", "a specific examples", or "some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A method for forming a semiconductor gate structure, comprising:
   providing a substrate with a Ge layer as a surface thereof;
   forming a Sn layer on the Ge layer, wherein an interface between the Ge layer and the Sn layer is a GeSn layer;
   removing the Sn layer to expose the GeSn layer;
   forming a GeSnO$_x$ passivation layer by performing an oxidation treatment for the GeSn layer, or forming a GeSnN or GeSnON passivation layer by performing a passivation treatment for the GeSn layer; and
   forming a gate stack on the GeSnO$_x$, GeSnN or GeSnON passivation layer.

2. The method according to claim 1, before removing the Sn layer, further comprising:
   performing an annealing process to improve the GeSn layer.

3. The method according to claim 1, wherein the Sn layer is removed by a solution with a high etching selection ratio between Sn and GeSn to expose the GeSn layer.

4. The method according to claim 3, wherein a thickness of the GeSn layer remained ranges from 0.5nm to 40nm.

5. The method according to claim 1, wherein the oxidation treatment comprises: performing an oxidation annealing in an atmosphere containing oxygen and/or oxygen plasma to change all or a part of the GeSn layer into the GeSnO$_x$ passivation layer; and
   the passivation treatment comprises: performing a passivation annealing in an atmosphere containing nitrogen and/or nitrogen plasma to change all or a part of the GeSn layer into the GeSnN or GeSnON passivation layer.

6. The method according to claim 5, wherein a temperature of the oxidation annealing ranges from 100° C. to 500° C., and a temperature of the passivation annealing ranges from 100° C. to 600° C.

7. The method according to claim 1, wherein the oxidation treatment comprises: performing a wet chemical oxidation in an oxidizing solution to change all or a part of the GeSn layer into the $GeSnO_x$ passivation layer.

8. The method according to claim 1, wherein the substrate with the Ge layer as the surface thereof comprises a pure Ge substrate or a substrate with a Ge film as a surface layer thereof.

\* \* \* \* \*

UNITED STATES PATENT AND TRADEMARK OFFICE
CERTIFICATE OF CORRECTION

| | | |
|---|---|---|
| PATENT NO. | : 9,006,088 B2 | Page 1 of 1 |
| APPLICATION NO. | : 13/980803 | |
| DATED | : April 14, 2015 | |
| INVENTOR(S) | : Mei Zhao et al. | |

It is certified that error appears in the above-identified patent and that said Letters Patent is hereby corrected as shown below:

Title Page (56), for U.S. Publication No. 2013/0288480 A1, delete "1/2013" and insert therefore

--10/2013--.

Signed and Sealed this
Twelfth Day of April, 2016

Michelle K. Lee
*Director of the United States Patent and Trademark Office*